US012788003B2

(12) United States Patent
Deuscher

(10) Patent No.: US 12,788,003 B2
(45) Date of Patent: Nov. 10, 2026

(54) BAIT SCALE DEVICE AND REMOTE MONITORING DEVICE CONFIGURED TO RECEIVE SIGNALS FROM A BAIT SCALE DEVICE

(71) Applicant: Zepta Technologies GmbH, Dresden (DE)

(72) Inventor: Thomas Reinhard Deuscher, Limburgerhof (DE)

(73) Assignee: Zepta Technologies GmbH, Dresden (DE)

( * ) Notice: Subject to any disclaimer, the term of this patent is extended or adjusted under 35 U.S.C. 154(b) by 313 days.

(21) Appl. No.: 18/559,804

(22) PCT Filed: May 9, 2022

(86) PCT No.: PCT/EP2022/062416
§ 371 (c)(1),
(2) Date: Nov. 9, 2023

(87) PCT Pub. No.: WO2022/238292
PCT Pub. Date: Nov. 17, 2022

(65) Prior Publication Data

US 2024/0237630 A1 Jul. 18, 2024

(30) Foreign Application Priority Data

May 11, 2021 (EP) .................................... 21173275

(51) Int. Cl.
*A01M 23/24* (2006.01)
*A01M 23/30* (2006.01)
(Continued)

(52) U.S. Cl.
CPC .......... *A01M 23/245* (2013.01); *A01M 23/30* (2013.01); *G01G 19/52* (2013.01); *G01G 23/18* (2013.01); *G01R 31/371* (2019.01)

(58) Field of Classification Search
CPC ...... G01G 23/18; G01G 19/52; G01R 31/371; A01M 23/245; A01M 23/30; A01M 25/004
See application file for complete search history.

(56) References Cited

U.S. PATENT DOCUMENTS 4,941,356 A 7/1990 Pallaske
9,532,564 B1 * 1/2017 Walsh ................ A01M 25/004
(Continued)

FOREIGN PATENT DOCUMENTS

CN 107747963 A 3/2018
CN 109497034 A * 3/2019 ........... A01M 23/38
(Continued)

OTHER PUBLICATIONS

International Preliminary Report on Patentability received for PCT Patent Application No. PCT/EP2022/062416, mailed on Nov. 23, 2023, 8 pages.
(Continued)

*Primary Examiner* — Natalie Huls
(74) *Attorney, Agent, or Firm* — INTELLECTUAL PROPERTY LAW GROUP LLP

(57) ABSTRACT

A bait scale device (2) and a remote monitoring device (16) are provided. The bait scale device (2) comprises a bait holder (4) for receiving a bait product: an electronic weighing unit (7): a power source (9) providing electric power: a timing device (11.1) and signaling means (11.1, 12). The electronic weighing unit (7) is configured to measure the weight of the bait held by the bait holder (4) and the timing device (11.1) is configured to activate the power source (9) and trigger a weight measurement by the electronic weighing unit (7) in predetermined time intervals. The signaling means (11.1, 12) are configured to generate a signal (17) corresponding to the measured weight and transmit said signal (17) to a remote monitoring device (16). The remote
(Continued)

monitoring device (16) is configured to receive signals (17) corresponding to a measured weight from said bait scale device (2).

14 Claims, 4 Drawing Sheets

(51) Int. Cl.

| | |
|---|---|
| ***G01G 19/52*** | (2006.01) |
| ***G01G 23/18*** | (2006.01) |
| ***G01R 31/371*** | (2019.01) |

(56) References Cited

U.S. PATENT DOCUMENTS

| | | | | |
|---|---|---|---|---|
| 12,376,581 | B1 * | 8/2025 | Kauffman | A01M 25/004 |
| 2002/0062205 | A1 | 5/2002 | Roberts | |
| 2016/0356641 | A1 * | 12/2016 | Larson | G01G 17/04 |
| 2017/0318796 | A1 * | 11/2017 | Vaisblat | A01M 25/004 |
| 2017/0360026 | A1 * | 12/2017 | Zirkle | A01M 25/004 |
| 2019/0075783 | A1 * | 3/2019 | Buchstaller | A01M 25/004 |
| 2020/0253186 | A1 * | 8/2020 | Files | A01M 19/00 |
| 2020/0315157 | A1 * | 10/2020 | Buchstaller | G01G 19/00 |

FOREIGN PATENT DOCUMENTS

| | | | |
|---|---|---|---|
| FR | 3092966 | A1 | 8/2020 |
| WO | 2012/120263 | A1 | 9/2012 |
| WO | 2016/094274 | A1 | 6/2016 |

OTHER PUBLICATIONS

International Search Report and Written Opinion received for PCT Patent Application No. PCT/EP2022/062416, mailed on Jul. 11, 2022, 10 pages.

* cited by examiner

BAIT SCALE DEVICE AND REMOTE MONITORING DEVICE CONFIGURED TO RECEIVE SIGNALS FROM A BAIT SCALE DEVICE

CROSS-REFERENCE TO RELATED APPLICATIONS

This application is a National stage application (under 35 U.S.C. § 371) of PCT/EP2022/062416, filed May 9, 2022, which claims benefit of European Application No. 21173275.5, filed May 11, 2021, both of which are incorporated herein by reference in their entirety.

FIELD OF THE INVENTION

The present invention relates to a bait scale device, particularly to a rodent bait scale device, more particularly to a rodent bait scale device that can be universally used in any rodent bait station. The present invention further relates to a remote monitoring device configured to receive signals from a bait scale device.

BACKGROUND OF THE INVENTION

The invention relates to pest control, in particular the control of rodents such as mice and rats. In large areas such as social housing, industrial facilities, commercial space and multi-story office buildings, a significant number of bait stations may need to be made available for control. Until now, they had to be visited regularly by a technician to check if there was a bait take. If necessary, a new baiting was carried out. This way of working requires a high technician time and therefore cost. This is particularly annoying when bait stations have to be checked, even though no bait take has been made.

The French patent application 3 092 966 A1 describes a module for the application of rodenticide products with real-time monitoring. The module comprises mechanical means configured to receive a rodenticide product and to generate a mechanical action according to the quantity of rodenticide product present. The module further comprises electronic means configured to generate a signal and to transmit said signal to a remote server. The electronic means are further configured to, when supplied with energy by a power supply source, detect the mechanical action generated by the mechanical means, generate an electronic signal relating to the mechanical action detected, and transmit said signal to a remote server. Said module, however, is not configured to constantly monitor the consumption of the rodenticide products.

Other remote pest monitoring systems are described in US patent application US 2002/0062205 A1 and in the International applications WO 2012/120263 A1 and WO 2016/094274 A1.

SUMMARY OF THE INVENTION

It is therefore an object of the present invention to provide a bait scale device that automatically performs controls of the bait station and therefore spares technician time.

The object of the present invention is solved by the subject matter of the independent claims, wherein further embodiments are incorporated in the dependent claims.

According to a first aspect of the invention, a bait scale device is provided. The bait scale device may be used to control baiting of a wide variety of animals. The bait scale device may be particularly used to control baiting of pests, more particularly of rodents such as mice and rats.

The bait scale device comprises a bait holder for receiving a bait product. The bait holder may comprise an interlock to securely hold the bait product. The bait product may be horizontally placed on the bait holder. As an example, the bait holder may be a tray onto which the bait product may be placed. As another example, the bait holder may comprise two or more hangers such that the bait may be arranged on a skewer between the two or more hangers. In particular, the bait holder may receive up to 500 g of the bait product.

The bait scale device further comprises an electronic weighing unit. The electronic weighing unit is configured to measure the weight of a bait held by the bait holder. Here, measuring the weight of the bait is to be broadly interpreted. As an example, the electronic weighing unit may measure the weight of the bait together with the bait holder. By subtracting the known weight of the weight holder, the weight of the bait may be obtained. As another example, the electronic weighing unit may measure the weight of the bait along with the entire bait scale device. In this case, the weight of the bait may be obtained by subtracting the known weight of the entire bait scale device from the measured weight.

There exists a wide variety of technical implementations of electronic weighing units. As an example, the electronic weighing unit may be based on pressure sensors. As another example, the electronic weighing unit may be based on a deformation measurement of a deformable part.

The bait scale device further comprises a power source. The power source provides electric power to the components of the bait scale device, in particular to the electronic weighing unit, to the timing device and to the signaling means. The power source may be at least one battery or a connector for connecting at least one battery.

The bait scale device further comprises a timing device. The timing device is configured to activate the power source and trigger a weight measurement, i.e., a measurement of the weight of the bait as described above, by the electronic weighing unit in predetermined time intervals. In particular, said activation of the power source is only temporarily. Since the power source is activated only in the predetermined time intervals, electric power is only used for short periods of time and the bait scale device is idle for the remainder of the time. Hence, only little electric power is used and the power source may last a long time, e.g., up to a year. Therefore, recharging or changing a battery has to be performed only very infrequently. As an example, the measurements may be performed twice a day, i.e., the time interval may be twelve hours. As another example, the time interval may be one hour and as yet another example, the time interval may be one week.

The bait scale device further comprises signaling means configured to generate a signal corresponding to the measured weight and transmit said signal to a remote monitoring device.

In order to achieve this, the signaling means may be connected to the electronic weighing unit, such that the results of the weight measurement may be received by the signaling means. Since the signal corresponding to the measured weight is transmitted to the remote monitoring device, the remaining weight of the bait held by the bait holder may be remotely checked. Hence, it is not necessary to perform a local control of a bait station by a technician just to check whether or not there has been any bait take. Therefore, technician time is saved and consequently costs are reduced.

The bait scale device may comprise an additional power source providing electric power to the timing device. Said additional power source may be, in particular, a long-life battery. Since the timing device is powered by the additional power source, the power source may be completely turned off while the bait scale device is idle, which further improves the endurance of the power source.

The timing device may be directly connected to the power source. The power consumption of the timing device in a direct connection to the power source is very low. Further, the timing device may have a connection to the electric circuit or electric circuits in which the electronic weighing unit and/or the signaling means are arranged, in particular to an electronic switch in said electric circuit(s). That way, the power source may be activated for the electronic weighing unit and/or the signaling means by the timing device, while there is only very little electric energy consumption by the timing device in the idle state of the bait scale device.

According to an embodiment, the bait scale device comprises an on/off switch. With said switch, the bait scale device may be turned off when not in use and may be turned on again when measurements of the weight of the bait shall be performed and signals corresponding to the measured weight shall be transmitted. Turning the bait scale device off saves electric power and prevents the bait scale device from transmitting signals when no actual baiting takes place.

According to an embodiment, the bait scale device comprises a visual operation indicator. The visual operation indicator may be an LED and indicates the weight measurements and/or signal transmissions. The visual operation indicator is especially useful for checking the operation status of the bait scale device.

According to an embodiment, the predetermined time intervals are adjustable. The range of predetermined time intervals may be from a minute to a year. Particularly, the range of predetermined time intervals may be from ten minutes to a week. Hence, the bait scale device may be optimized for the current baiting task. As an example, for a long-term monitoring of rodents, time intervals of one day to one week are sufficient. If, on the other hand, there has been a rodent outbreak in the vicinity, shorter time intervals such as one hour should be used to provide a closer monitoring.

According to an embodiment, the signaling means are configured to operate with at least one signaling option out of a group of signaling options. The group of signaling options consists of wireless LAN, wireless mobile telecommunication and low-power wide-area network. The choice between the different signaling options may be made, e.g., based on availability, range and/or power consumption. It may also be possible to choose between different signaling options or to transmit the signals with more than one signaling option.

According to an embodiment, the signal comprises the weight of the bait. Hence, the weight of the bait is transmitted to a remote monitoring device and an operator or an automatic method may check, e.g., for changes in the weight of the bait which indicate bait take. Additionally or alternatively, the signal comprises a change in weight of the bait. Hence, the change in weight of the bait since the last measurement was taken is transmitted to the remote monitoring device. Hence, on operator or an automatic method may directly be informed about a change in weight, corresponding to a bait take. The weight and/or the change in weight may be exact to one gram or even to a fraction of a gram, e.g., 1/10 g.

According to an embodiment, the signal comprises additional data. Said additional data may be position data, obtained, e.g., from a satellite navigation system or by multilateration of mobile telecommunication signals or wireless network signals. The position data may, e.g., be used to find the location of the bait scale device. Additionally or alternatively, the additional data may be weather data, e.g., providing information about the temperature and humidity at the location of the bait scale device. The additional data may also be a bait scale device identifier such as a serial number or another unique string. With the bait scale device identifier, the weight measurements may be allocated to the bait scale device such that an operator knows which bait has been taken and which bait scale devices have to be refilled. The additional data may also be a bait take time, which is, e.g., estimated as the time at which a significant change in bait weight occurred. In a preferred embodiment, a choice can be made which additional data is transmitted. This choice may be made, e.g., via a software of the signaling means or via adjustments of a micro-controller of the signaling means.

According to an embodiment, the signal comprises an alert signal if the weight of the bait falls below a predetermined weight alert threshold and/or the change in weight of the bait exceeds a predetermined weight change alert threshold. Said alert signal may be directly recognized by the remote monitoring device and trigger an alert. The weight alert threshold may be preset or adjustable. As an example, there may be a weight alert threshold, e.g., set at 30% of the starting weight of the bait, which alerts a technician to refill the bait. Also, the predetermined weight change alert threshold may be preset or adjustable. Preferably, the weight change alert threshold is set such that an emerging pest infestation may be reliably recognized.

According to an embodiment, the signal is transmitted in predetermined transmit time intervals. Preferably, said predetermined transmit time intervals are integer multiples of the predetermined time intervals. In particular, the transmit time intervals are equal to the time intervals, i.e., a signal is transmitted for every weight measurement. Said predetermined transmit time intervals may be adjusted in order to achieve an optimal configuration of the bait scale device.

According to an embodiment, the signal is transmitted if the weight of the bait falls below a predetermined weight threshold. As an example, the predetermined weight threshold may be 30% of the starting weight of the bait product. If the measured weight is less than this, it is recommended that the bait is refilled by a technician. Additionally or alternatively, the signal is transmitted if the change in weight of the bait exceeds a predetermined weight change threshold. Such a change in weight indicates a bait take and an operator may be alerted by the signal.

Also, a combination of the signal transmission in predetermined time intervals and in case of the weight of the bait falling below a predetermined weight threshold or the change in weight of the bait exceeding a predetermined weight change threshold is possible. As an example, signals are only transmitted every ten weight measurements. However, if action is required at the bait station comprising the bait scale, such as if bait has to be refilled or if there is a high amount of bait take that needs to be closely monitored, signals are transmitted in addition to the signals at the predetermined time intervals.

According to an embodiment, the predetermined weight threshold and/or the predetermined weight change threshold are adjustable. Hence, an optimal configuration of the bait scale device may be achieved.

According to an embodiment, the power source is a rechargeable battery. This is both environmentally friendly and avoids the need to open the bait scale device to exchange a battery. Recharging may be performed via a wired connection, such as a USB-C connection, which allows for very quick recharging. Alternatively, the bait scale device may comprise a wireless charging connection such that recharging may be performed wirelessly, e.g., via inductive recharging. This has the advantage that no connectors and no cables are necessary for recharging the battery.

According to an embodiment, a signal is transmitted if the charge of the battery falls below a predetermined charge threshold. Said signal may be transmitted as part of the signal comprising the weight measurement or may be a separate signal. Upon receipt of said signal, a technician may exchange or recharge the battery.

According to an embodiment, the size of the bait scale device is such that it fits into standard rodent bait stations. In particular, said standard rodent bait stations are rodent bait stations with space for a mechanical rat snap trap. In particular, a length of the bait scale device is equal to or less than 140 mm, a width of the bait scale device is equal to or less than 85 mm and a height of the bait scale device is equal to or less than 90 mm. More particularly, a length of the bait scale device is equal to or less than 110 mm, a width of the bait scale device is equal to or less than 65 mm and a height of the bait scale device is equal to or less than 85 mm. Hence, commercially available rodent bait stations may be used to accommodate the bait scale device. The commercially available rodent bait stations may also be tamper resistant and may obey baiting regulations and/or laws. Moreover, commercially available rodent bait stations may be obtained for a low cost.

According to another aspect of the invention, a remote monitoring device is provided. The remote monitoring device is configured to receive signals corresponding to a measured weight from a bait scale device according to the above description. The remote monitoring device may, e.g., be a smart phone, a tablet computer or a computer equipped with a suitable application program. The remote monitoring device may also be a computer equipped with a professional pest documentation program. Alternatively, the remote monitoring device may be a web server providing a web-based platform through which users may access the information.

The remote monitoring device is further configured to display weights of the bait. The weights may be displayed to an accuracy of grams or even tenth of a gram, or corresponding other units. As an example, a user may choose for which bait scale device he wants to see the information and then the information is displayed, e.g., either as a numerical value or as a graph showing a history of the weights of the bait. Additionally or alternatively, changes in weight of the bait may be displayed. Also, further information may be displayed, such as position data of the bait scale device. This position data may be displayed as coordinates or as a point on a map. The position data may have been obtained from a position sensor of the bait scale device, e.g., a satellite navigation system sensor. Additionally or alternatively, the position data may have been obtained when placing the bait scale device and saved to the remote monitoring device. Based on a bait scale device identifier which uniquely identifies the bait scale device, the saved position can then be assigned to the respective bait scale device and the corresponding weight measurements. Also, weather data collected by the bait scale device may be displayed, e.g., temperature, humidity or wind. This may help in assessing whether or not favorable conditions for pests such as rodents are present. Further, a time of bait take may be displayed to the user. This may help in determining the history of the bait takes and in assessing whether or not a pest infestation is still present.

According to an embodiment, the remote monitoring device is further configured to trigger an alert if the weight of the bait falls below a predetermined weight alert threshold. Such an alert may be visual and/or audible and may be, e.g., a push message in an application, a text message, an e-mail or an automated phone call. The weight alert threshold may be preset or adjustable and there may be more than one weight alert threshold, corresponding to different scenarios. As an example, there may be a weight alert threshold, e.g., set at 30% of the starting weight of the bait, which alerts a technician to refill the bait. As another example, there may be a weight threshold for the combined weights of all monitored baits, e.g., set at 40% of the starting weight of the combined weights, alerting a facility manager or a farmer to reorder bait products. Additionally or alternatively, an alert is triggered if the change in weight of the bait exceeds a predetermined weight change alert threshold. The predetermined weight change alert threshold may also be preset or adjustable. Preferably, the weight change alert threshold is set such that an emerging pest infestation may be reliably recognized.

According to an embodiment, the remote monitoring device is further configured to evaluate a plurality of signals corresponding to the measured weight. As an example, the average bait weight reduction over a set period of time may be displayed for a plurality of bait scale devices in a map. That way, infestation hot spots may be more easily recognized. As another example, the received signals corresponding to a measured weight may evaluated for further measures, such as gathering, transmission, processing, storage, access, presentation, monitoring and management.

BRIEF DESCRIPTION OF THE DRAWINGS

These and other aspects of the invention will be apparent from and elucidated further with reference to the embodiments described by way of examples in the following description and with reference to the accompanying drawings, in which.

Figure 1:
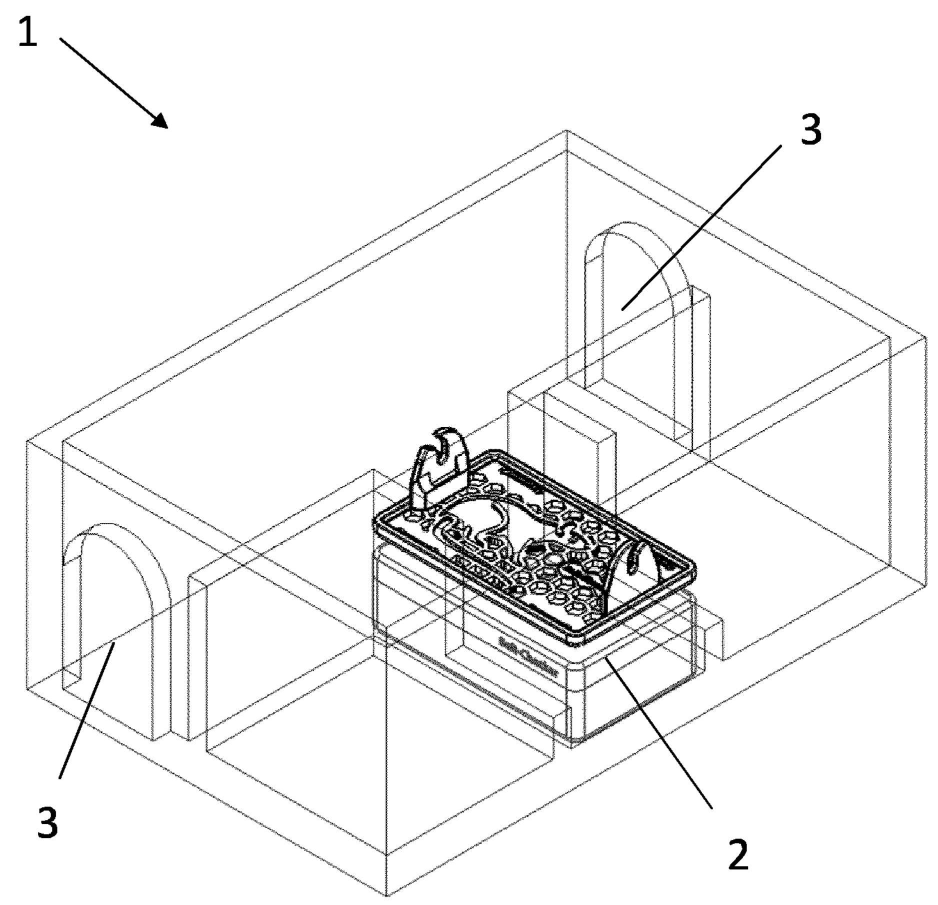
FIG. 1 shows a rodent bait station with a bait scale device.

It should be noted that some of the figures are purely diagrammatic and not drawn to scale. In the figures, elements which correspond to elements already described may have the same reference numerals. Examples, embodiments or optional features, whether indicated as non-limiting or not, are not to be understood as limiting the invention as claimed.

DETAILED DESCRIPTION OF EXEMPLARY EMBODIMENTS

FIG. 1 shows a rodent bait station 1 with a bait scale device 2. The rodent bait station 1 is a standard rodent bait station 1 configured to accommodate a mechanical rat snap trap. Instead of the rat snap trap, the bait scale device 2 is placed. This is possible since the size of the bait scale device 2 is such that it fits into rodent bait stations 1, i.e., its length is equal to or less than 140 mm, its width is equal to or less than 85 mm and its height equal to or less than 90 mm. The rodent bait station 1 itself is tamper-proof and exhibits two access points 3 through which rodents may enter the rodent bait station 1. Inside the rodent bait station 1, the rodents may consume bait. The weight of the bait is measured by the bait scale device 2 and transmitted to a remote monitoring device. There, the measured weight of the bait can be used, e.g., to determine when bait has to be refilled and/or to determine the degree of rodent infestation.

Figure 2:
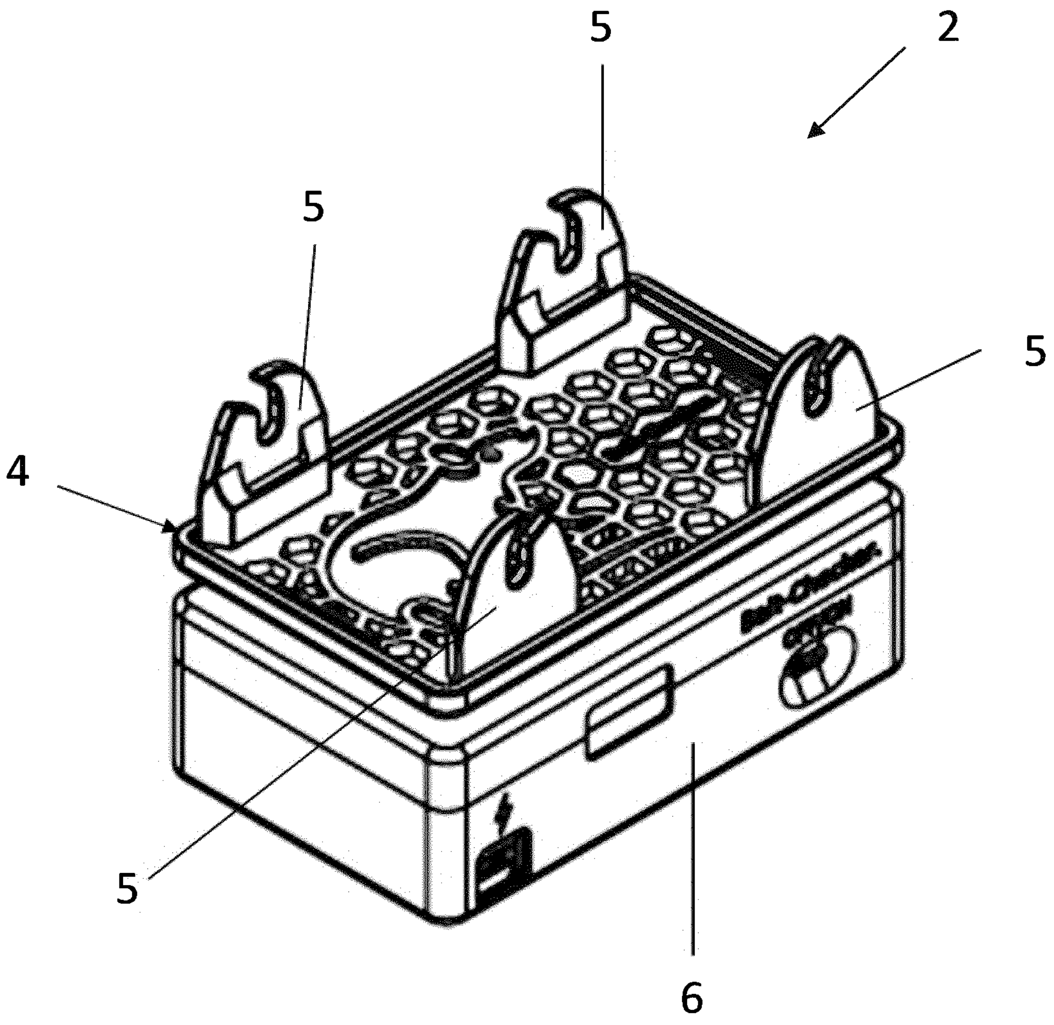
FIG. 2 shows a perspective view of an embodiment of a bait scale device.

FIG. 2 shows a perspective view of an embodiment of a bait scale device 2. The bait scale device 2 comprises a bait holder 4 which is configured to receive a bait product. In this embodiment, the bait holder 4 comprises two pairs of hangers 5 such that two skewers loaded with bait may be supported by the respective pairs of hangers 5. Other bait holders 4 such as simple trays on which the bait may be put may be used instead of the bait holder 4 shown in this Figure. The bait scale device 2 further comprises a base unit 6 that houses the electronics. The base unit 6 will be described in more detail in FIG. 3.

Figure 3:
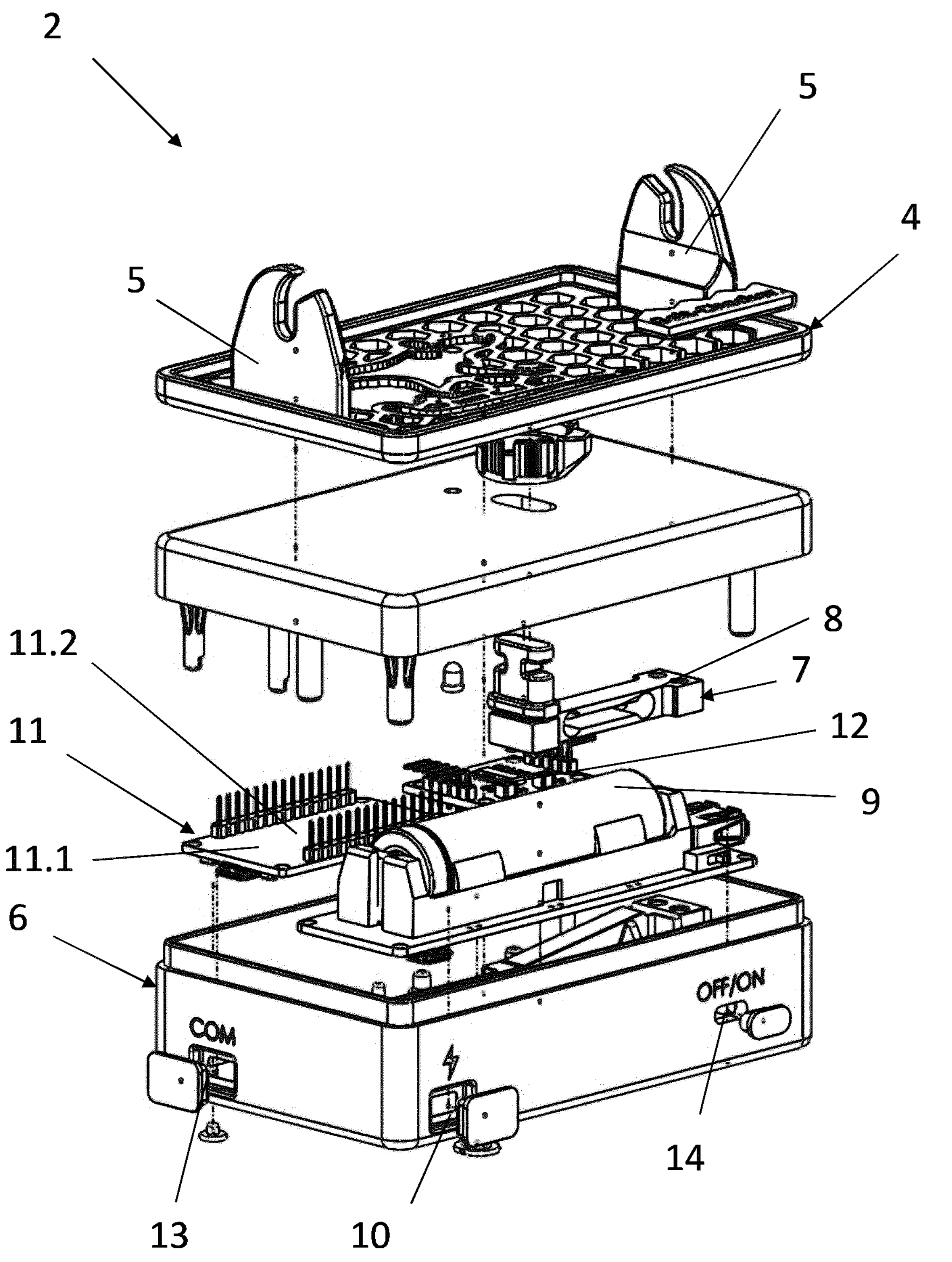
FIG. 3 shows an exploded view of another embodiment of a bait scale device.

FIG. 3 shows an exploded view of another embodiment of a bait scale device 2. Here, the bait holder 4 comprises only 2 hangers 5, such that only one skewer loaded with bait may be supported between the hangers 5.

The base unit 6 houses the electronics of the bait scale device 2. In particular, it houses an electronic weighing unit 7 which is configured to measure the weight of the bait held by the bait holder 4. In the present embodiment, the weight of the bait holder 4 loaded with the bait bends a deformable part 8 of the electronic weighing unit 7. The amount of bending, which increases as the weight of the bait increases, is measured by the electronic weighing unit 7 and hence the weight of the bait is determined. Other electronic weighing units 7, such as electronic weighing units 7 based on a pressure detection, may also be used instead of the electronic weighing unit 7 described here.

The base unit 6 further comprises a power source 9. The power source 9 provides electric power to the electronics of the bait scale device 2. According to the present embodiment, the power source 9 is a fixed, rechargeable battery and may be charged via a cable, in particular a USB-C cable, connecting at a charging port 10. Other possible embodiments may feature a wireless charging option, transferring the electric energy, e.g., by magnetic induction. Yet other possible embodiments may feature replaceable batteries. While this saves the time needed for charging, the base unit 6 has to be opened to replace the batteries.

Among the electronics of the base unit 6 is a circuit board 11. The circuit board 11 comprises a timing device 11.1. The timing device 11.1 is configured to activate the power source 9 and trigger a weight measurement by the electronic weighing unit 7 in predetermined time intervals. Since the power source 9 is activated only at the predetermined time intervals, the bait scale device is idle for a majority of the time and active only for relatively short time periods. Hence, the power source 9 may last for one year or even longer.

The circuit board 11 further comprises a signal generation unit 11.2 which is configured to generate a signal corresponding to the weight of the bait measured by the weighing unit 7. The signal generated by the signal generation unit 11.2 is then amplified by an amplifier 12 and transmitted to a remote monitoring device.

The base unit 6 further comprises a communication port 13, enabling wired communication between the bait scale device and, e.g., a smart phone or a laptop computer. Via said wired communication, the predetermined time intervals and/or other parameters of the bait scale device may be adjusted. Additionally or alternatively, said communication may also be performed via the charging port 10 or via a wireless connection. The predetermined time intervals may be adjusted, e.g., based on a current rodent infestation status. If, for example, no or only few rodents have been detected in a vicinity of the bait scale device 2, a long-term monitoring of the rodents with time intervals of one day to one week is sufficient. If, on the other hand, there has been a rodent outbreak in the vicinity, shorter time intervals such as one hour should be used to provide a closer monitoring.

The bait scale device 2 may comprise an additional power source (not shown here) providing electric power to the timing device 11.1. Said additional power source may be, in particular, a long-life battery. Since the timing device 11.1 is powered by the additional power source, the power source 9 may be completely turned off while the bait scale device 2 is idle, which further improves the endurance of the power source 9.

The timing device 11.1 may be directly connected to the power source 9. The power consumption of the timing device 11.1 in a direct connection to the power source 9 is very low. Further, the timing device 11.1 may have a connection to the electric circuit or electric circuits in which the electronic weighing unit 7, the signal generation unit 11.2 and/or the amplifier 12 are arranged, in particular to an electronic switch in said electric circuit(s). That way, the power source 9 may be activated for the electronic weighing unit 7, the signal generation unit 11.2 and/or the amplifier 12 by the timing device 11.1, while there is only very little electric energy consumption by the timing device 11.1 in the idle state of the bait scale device 2.

An on/off switch 14 provided on a front side of the base unit 6 allows turning the bait scale device 2 on and off. Turning the bait scale device 2 off while it is not in use is advantageous, since it saves battery power and prevents the bait scale device 2 from transmitting signals that do not correspond to an actual baiting use of the bait scale device 2.

Figure 4:
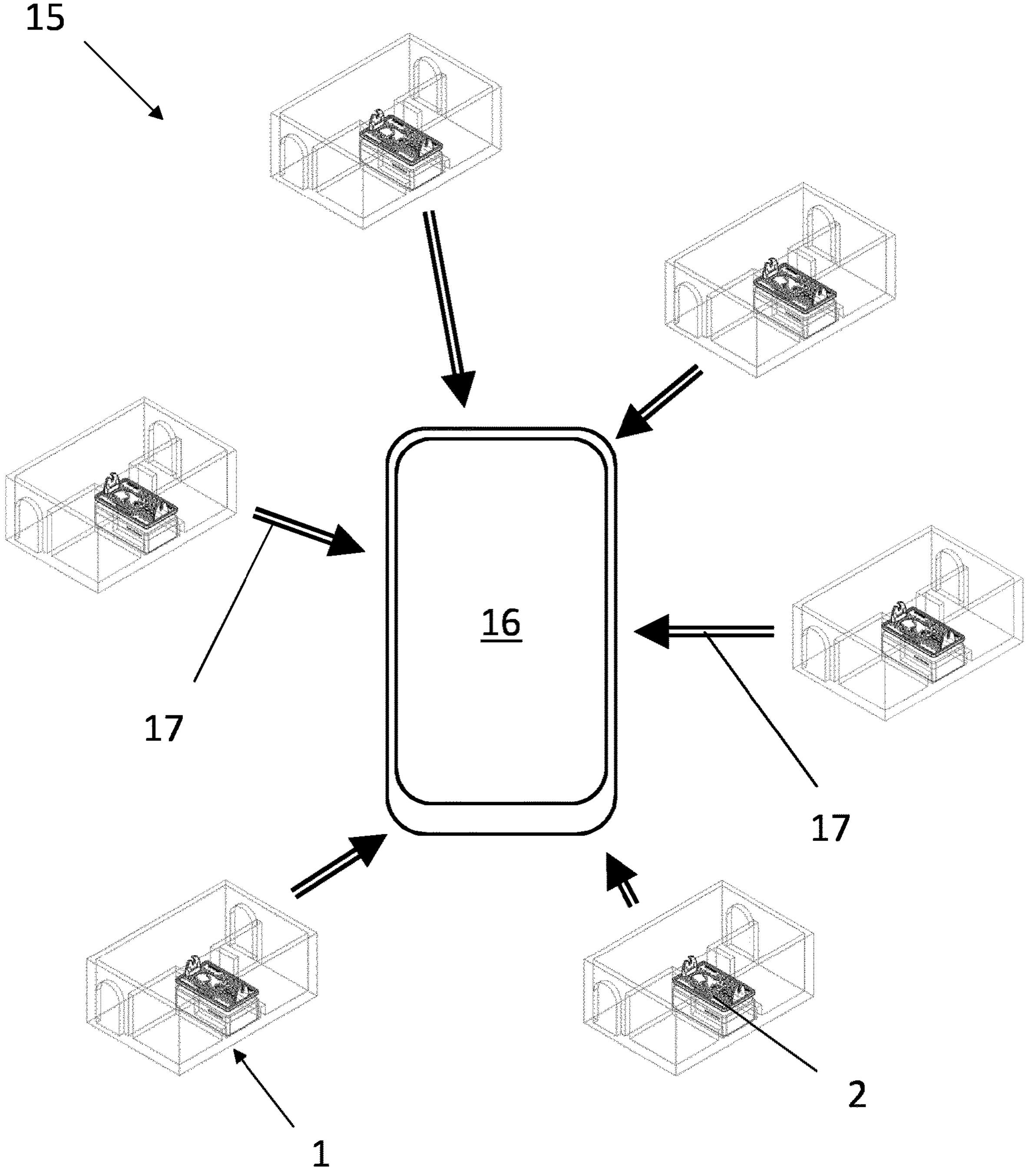
FIG. 4 shows a schematic view of a modular baiting system.

FIG. 4 shows a schematic view of a modular baiting system 15 comprising a plurality of rodent bait stations 1 with bait scale devices 2 and a remote monitoring device 16. The remote monitoring device 16 is shown as a smart phone but may as well be a tablet computer, a laptop computer, a computer or a web server. The remote monitoring device 16 is configured to receive the signals 17 generated and transmitted by the bait scale devices 2.

The weights of the bait measured by the bait scale devices 2 and received by the remote monitoring device 16 may be used in a variety of ways. As an example, bait weights at the different bait scale devices 2 may be checked. The weights of the bait or changes in the weights of the bait may also be displayed on a map, indicating the weights or changes in weight for the different bait scale devices 2, such that, e.g., areas with a high pest infestation may be easily recognized. Also, alerts may be triggered based on the received bait weight measurements. As an example, if the weight of the bait falls below a predetermined weight alert threshold, an alert is triggered to notify a technician to refill the bait at the corresponding rodent bait station 1. As another example, if the combined weight of the bait of a plurality or all of the bait stations falls below a predetermined weight alert threshold, an alert is triggered to notify a user to reorder bait products. As yet another example, if the change in weight of the bait exceeds a predetermined weight change alert threshold, an alert is triggered to notify a user of a possible emerging rodent infestation.

It has to be noted that embodiments of the invention are described with reference to different subject matters. In particular, some embodiments are described with reference to method type claims whereas other embodiments are described with reference to the device type claims. However, a person skilled in the art will gather from the above and the following description that, unless otherwise notified, in addition to any combination of features belonging to one type of subject matter also any combination between features relating to different subject matters is considered to be disclosed with this application. However, all features can be combined providing synergetic effects that are more than the simple summation of the features.

While the invention has been illustrated and described in detail in the drawings and foregoing description, such illustration and description are to be considered illustrative or exemplary and not restrictive. The invention is not limited to the disclosed embodiments. Other variations to the disclosed embodiments can be understood and effected by those skilled in the art in practicing a claimed invention, from a study of the drawings, the disclosure, and the dependent claims. In the claims, the word "comprising" does not exclude other elements or steps, and the indefinite article "a" or "an" does not exclude a plurality. A single processor or other unit may fulfil the functions of several items re-cited in the claims. The mere fact that certain measures are re-cited in mutually different dependent claims does not indicate that a combination of these measures cannot be used to advantage. Any reference signs in the claims should not be construed as limiting the scope.

The invention claimed is:

1. Bait scale device comprising:

a bait holder for receiving a bait product;

an electronic weighing unit configured to measure the weight of a bait held by the bait holder;

a power source providing electric power;

a timing device configured to activate the power source from an idle state of the bait scale device and trigger a weight measurement by the electronic weighing unit in predetermined time intervals; and signaling means configured to generate a signal corresponding to the measured weight and transmit said signal to a remote monitoring device, wherein the signaling means are configured for transmitting the signal to the remote monitoring device in predetermined transmit time intervals; and wherein the power source is activated by the timer device from the idle state only at the predetermined time intervals and the predetermined transmit time intervals.

2. Bait scale device according to claim 1, wherein the predetermined time intervals are adjustable.

3. Bait scale device according to claim 1, wherein the signaling means are configured to operate with at least one signaling option out of a group, the group consisting of wireless LAN, wireless mobile telecommunication and low-power wide-area network.

4. Bait scale device according to claim 1, wherein the signal comprises at least one of a weight of the bait and a change in weight of the bait.

5. Bait scale device according to claim 1, wherein the signal comprises additional data, wherein the additional data is at least one out of a group, the group consisting of position data, weather data, bait scale device identifier and bait take time.

6. Bait scale device according to claim 1, wherein the signal comprises an alert signal if the weight of the bait falls below a predetermined weight alert threshold and/or the change in weight of the bait exceeds a predetermined weight change alert threshold.

7. Bait scale device according to claim 1, wherein the signaling means are configured for transmitting the signal if the weight of the bait falls below a predetermined weight threshold and/or the change in weight of the bait exceeds a predetermined weight change threshold.

8. Bait scale device according to claim 7, wherein the predetermined weight threshold and/or the predetermined weight change threshold are adjustable.

9. Bait scale device according to claim 1, wherein the power source is a rechargeable battery, wherein the bait scale device comprises a wireless charging connection.

10. Bait scale device according to claim 1, wherein the signaling means are configured for transmitting a signal if the charge of a battery falls below a predetermined charge threshold.

11. Bait scale device according to claim 1, wherein a size of the bait scale device is such that the bait scale device fits into rodent bait stations, wherein a length of the bait scale device is equal to or less than 140 mm; a width of the bait scale device is equal to or less than 85 mm; and a height of the bait scale device is equal to or less than 90 mm.

12. Remote monitoring device configured to receive signals corresponding to a measured weight from a bait scale device according to claim 1 and configured to display weights of the bait.

13. Remote monitoring device according to claim 12, further configured to trigger an alert if the weight of the bait falls below a predetermined weight alert threshold and/or the change in weight of the bait exceeds a predetermined weight change alert threshold.

14. Remote monitoring device according to claim 12, further configured to evaluate a plurality of signals corresponding to the measured weight.

* * * * *